(12) United States Patent
Dohmae

(10) Patent No.: US 8,404,567 B2
(45) Date of Patent: Mar. 26, 2013

(54) MANUFACTURING METHOD OF SEMICONDUCTOR DEVICE

(75) Inventor: Yusuke Dohmae, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 439 days.

(21) Appl. No.: 12/715,668

(22) Filed: Mar. 2, 2010

(65) Prior Publication Data
US 2010/0227454 A1 Sep. 9, 2010

(30) Foreign Application Priority Data

Mar. 5, 2009 (JP) .................................. 2009-051559

(51) Int. Cl.
*H01L 21/46* (2006.01)

(52) U.S. Cl. .......................... 438/464; 438/458; 438/459

(58) Field of Classification Search .................. 438/455, 438/458, 459, 460, 463, 464, 465
See application file for complete search history.

(56) References Cited

U.S. PATENT DOCUMENTS

| 4,722,130 | A * | 2/1988 | Kimura et al. .................. 29/413 |
| 6,294,439 | B1 * | 9/2001 | Sasaki et al. .................. 438/464 |
| 6,709,953 | B2 * | 3/2004 | Vasquez et al. ............... 438/460 |
| 7,140,951 | B2 * | 11/2006 | Kurosawa ..................... 438/460 |
| 7,351,645 | B2 | 4/2008 | Ohashi et al. |
| 2002/0055238 | A1 * | 5/2002 | Sugino et al. ................. 438/459 |
| 2005/0003636 | A1 * | 1/2005 | Takyu et al. .................... 438/464 |

FOREIGN PATENT DOCUMENTS

| JP | 2003-147300 | 5/2003 |
| JP | 2005-343997 | 12/2005 |
| JP | 2007-180252 | 7/2007 |
| WO | WO 03/043076 A2 | 5/2003 |

* cited by examiner

*Primary Examiner* — Kevin M Picardat

(74) *Attorney, Agent, or Firm* — Oblon, Spivak, McClelland, Maier & Neustadt, L.L.P.

(57) ABSTRACT

A manufacturing method of a semiconductor device, includes: forming grooves from a first surface side of a semiconductor wafer; separating plural chip areas into pieces by grinding a second surface of the semiconductor wafer after a protection sheet is attached to the first surface of the semiconductor wafer; attaching a laminated film in which a dicing film and an adhesive film are sequentially laminated on a supporting film composed of a resin film with high modulus of elasticity to the second surface of the semiconductor wafer; and cutting the adhesive film.

12 Claims, 8 Drawing Sheets

MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2009-051559, filed on Mar. 5, 2009; the entire contents of which are incorporated herein by reference.

BACKGROUND OF THE INVENTION

A manufacturing process of a semiconductor device (semiconductor chip) is roughly divided into a process forming semiconductor circuits, wiring layers, and so on at a front surface side of a semiconductor wafer, and a process cutting (separate into pieces) the semiconductor wafer in accordance with chip shapes. There is a tendency in which the semiconductor wafer is made thinner in accordance with high-performance, high-integration, downsizing and reduction in thickness, and so on of the semiconductor device. When the semiconductor wafer as stated above is processed, a process called a dicing before grinding is applied as a manufacturing process in which the process making a wafer thin and the process separating the chip into pieces are combined (refer to JP-A 2005-343997 (KOKAI) (Reference 1), JP-A 2007-180252 (KOKAI) (Reference 2)).

The dicing before grinding process is performed according to a procedure as stated below. At first, grooves of which depths are shallower than a wafer thickness and deeper than a chip finished thickness are formed at a semiconductor wafer from a front surface side where semiconductor circuits and so on are formed. Next, the semiconductor wafer is grinded from a rear surface side after a protection sheet is attached to the front surface side of the semiconductor wafer. The rear surface grinding of the semiconductor wafer is performed so as to reach the grooves formed from the front surface side. The semiconductor wafer is separated into respective chips by the rear surface grinding of the semiconductor wafer. The semiconductor chip is held by the protection sheet at this stage, and a wafer shape is maintained as a whole.

Next, an adhesive film such as a die-attach film is attached to the rear surface of the semiconductor wafer of which entire shape is maintained by the protection sheet. The adhesive film has an equivalent shape of the semiconductor wafer, and it is cut (separated into pieces) in accordance with respective chip shapes after it is attached to the rear surface of the semiconductor wafer. Accordingly, the adhesive film is attached as a laminated film with a dicing film. The adhesive film is cut by irradiating laser light from a front surface side along a dicing area between the semiconductor chips after the protection sheet is removed.

Array displacement is easy to occur in the semiconductor chips of which wafer shape is maintained as the entire shape when the separated semiconductor chips are transferred to the laminated film with the adhesive film and the dicing film because the dicing film to be laminated with the adhesive film has elasticity. It becomes difficult to cut the adhesive film by a laser process if the array displacement of the semiconductor chips becomes too large or a gap between the semiconductor chips becomes narrow affected by the array displacement. When the array displacement occurs in the semiconductor chips, an irradiation position of the laser light is controlled while checking the positions of the semiconductor chips. However, if the array displacement is large, the number of manufacturing processes increases because an control amount of the laser light increases, or according to circumstances, deterioration of cutting accuracy of the adhesive film and so on are incurred.

A viscous sheet having a rigid base material composed of a polyethylene terephthalate film, a polybutylene terephthalate film, or the like, a vibration relaxation layer arranged at one surface of the rigid base material, and a viscous layer arranged at the other surface of the rigid base material is described in the Reference 1. This viscous sheet is used for the dicing before grinding process of the semiconductor wafer. However, a concrete use application of this viscous sheet is a surface protection sheet when the rear surface of the semiconductor wafer is grinded, and a laminated film in which an adhesive film is laminated with a dicing film is not considered.

BRIEF SUMMARY OF THE INVENTION

A manufacturing method of a semiconductor device according to an aspect of the present invention includes: forming grooves along plural chip areas from a first surface side at a semiconductor wafer having the first surface in which the plural chip areas are arranged and a second surface at an opposite side of the first surface; separating the plural chip areas into pieces by grinding the second surface of the semiconductor wafer after a protection sheet is attached to the first surface of the semiconductor wafer while maintaining a shape of the semiconductor wafer by the protection sheet; attaching a laminated film in which a dicing film and an adhesive film are sequentially laminated on a supporting film composed of a resin film with high modulus of elasticity to the second surface of the semiconductor wafer held by the protection sheet; and cutting the adhesive film from the first surface side of the semiconductor wafer along the chip areas after the protection sheet is removed from the semiconductor wafer.

DETAILED DESCRIPTION OF THE INVENTION

Hereinafter, embodiments of a manufacturing method of a semiconductor device of the present invention are described.

Figure 6:
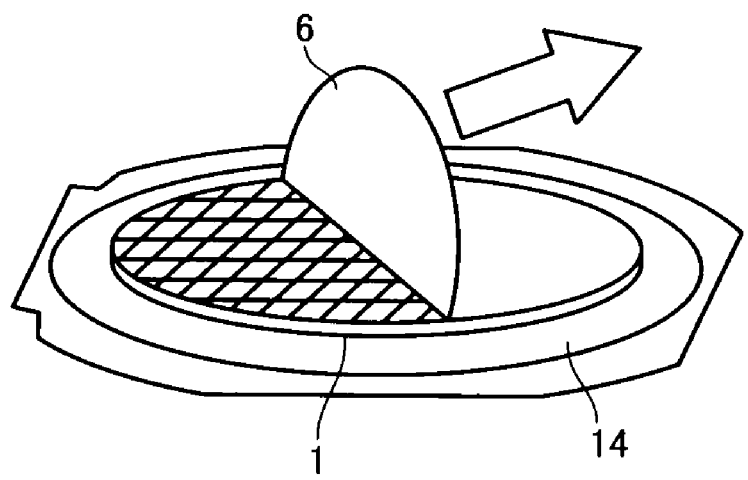
FIG. 6 is a perspective view illustrating a removal process of the protection sheet in the embodiment of the present invention.
Figure 7:
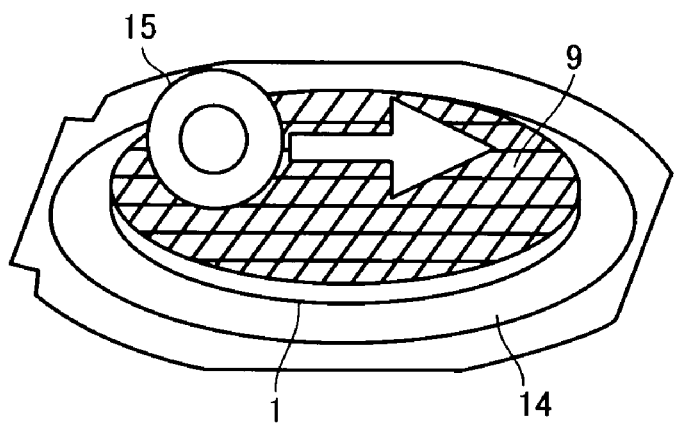
FIG. 7 is a perspective view illustrating a cutting process of the adhesive film by a blade in the embodiment of the present invention.
Figure 8:
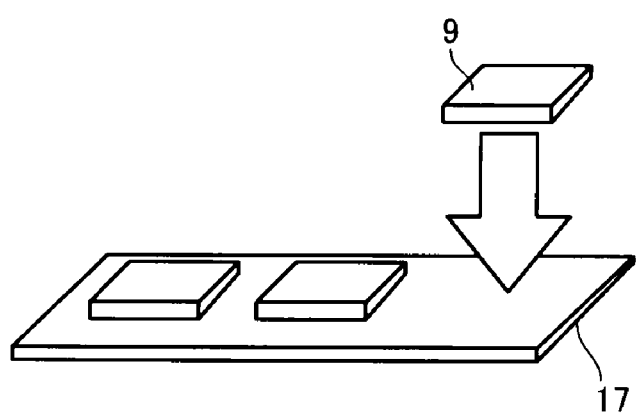
FIG. 8 is a perspective view illustrating a mounting process of semiconductor chips in the embodiment of the present invention.

FIG. 1 to FIG. 7 are views illustrating a manufacturing process of the semiconductor device according to the embodiment of the present invention, and are perspective views schematically illustrating the manufacturing process of the semiconductor device including a cutting process of a semiconductor wafer applying a dicing before grinding. FIG. 8 is a view illustrating a mounting process of separated semiconductor chips. FIG. 9 to FIG. 14 are sectional views corresponding to the manufacturing process of the semiconductor device illustrated in FIG. 1 to FIG. 7. The manufacturing process of the semiconductor device according to the embodiment of the present invention is described with reference to these views.

Figure 1:
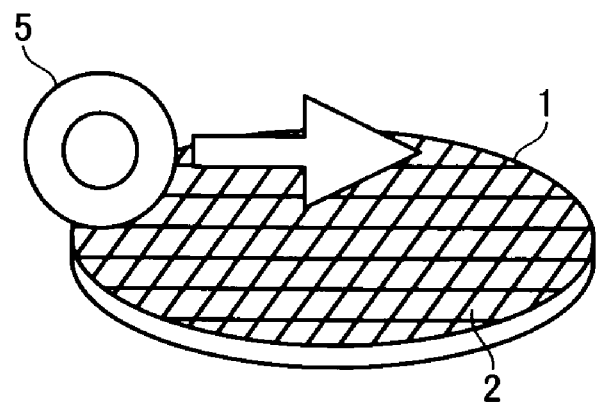
FIG. 1 is a perspective view illustrating a half dicing process of a semiconductor wafer in an embodiment of the present invention.
Figure 9:
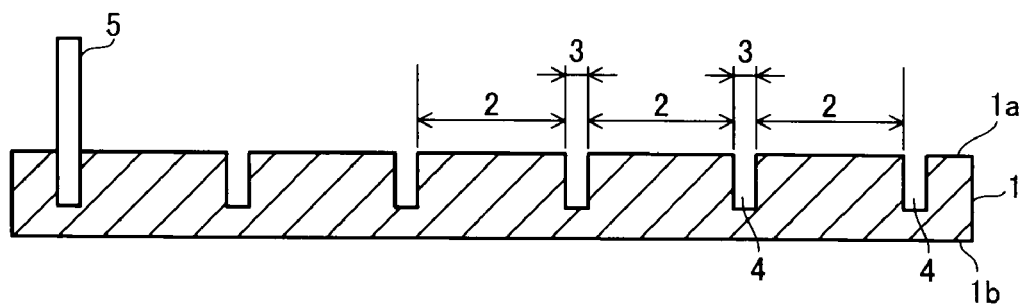
FIG. 9 is a sectional view illustrating the half dicing process of the semiconductor wafer in the embodiment of the present invention.

As illustrated in FIG. 1 and FIG. 9, a semiconductor wafer 1 in which semiconductor circuits and so on are formed at a front surface side is prepared. The semiconductor wafer 1 has a first surface (front surface) 1a in which plural chip areas 2 are arranged and a second surface (rear surface) 1b at an opposite side thereof. A semiconductor element part including the semiconductor circuits and wiring layers is formed at the chip area 2. Dicing areas 3 are arranged between the plural chip areas 2, and each of the plural chip areas 2 are separated into pieces and semiconductor chips are manufactured by cutting the semiconductor wafer 1 along the dicing areas 3.

When the semiconductor wafer 1 is cut, grooves 4 are at first formed at the semiconductor wafer 1 along the dicing areas 3 from the first surface 1a side as illustrated in FIG. 1 and FIG. 9. The groove 4 of the semiconductor wafer 1 is formed by using, for example, a blade 5 having a blade thickness in accordance with a width of the dicing area 3. A depth of the groove 4 is set to be shallower than a thickness of the semiconductor wafer 1 and deeper than a thickness of the semiconductor chip when it is finished. The groove 4 may be formed by an etching and so on. The grooves 4 having the depths as stated above are formed at the semiconductor wafer 1, and thereby, the plural chip areas 2 are respectively divided into states in accordance with finishing thickness of the semiconductor chips.

Figure 2:
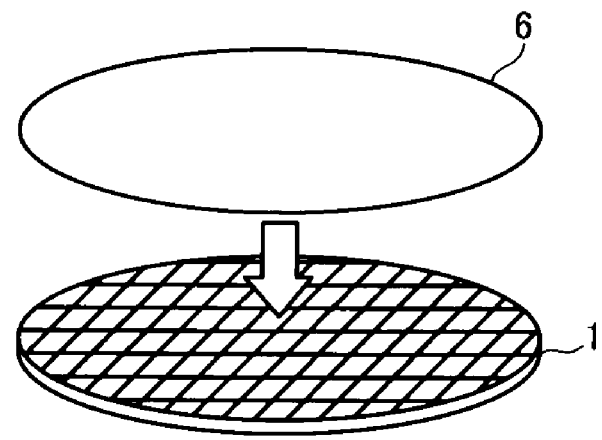
FIG. 2 is a perspective view illustrating an attaching process of a protection sheet in the embodiment of the present invention.
Figure 10:
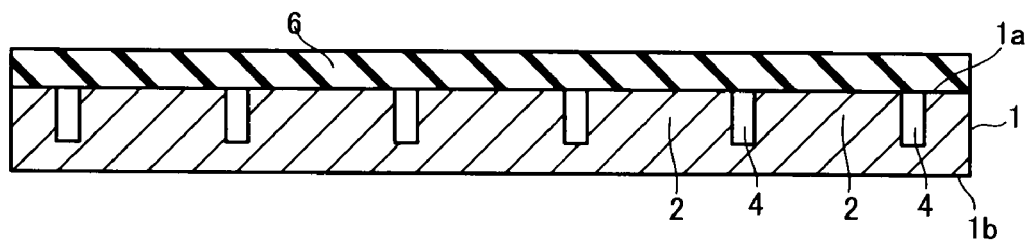
FIG. 10 is a sectional view illustrating the attaching process of the protection sheet in the embodiment of the present invention.

Next, as illustrated in FIG. 2 and FIG. 10, a protection sheet 6 is attached to the first surface (front surface) 1a of the semiconductor wafer 1 where the grooves 4 are formed. The protection sheet 6 protects the semiconductor element part arranged at the chip area 2 when the second surface (rear surface) 1b of the semiconductor wafer 1 is grinded at a subsequent process and maintains a shape of the semiconductor wafer 1 after the chip areas 2 are separated into pieces at the grinding process of the second surface 1b. For example, a resin sheet such as a polyethylene terephthalate (PET) sheet having a viscous layer is used as the protection sheet 6.

Figure 3:
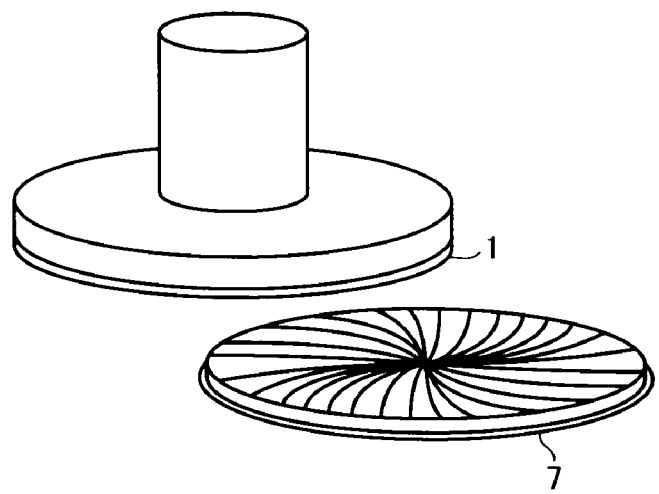
FIG. 3 is a perspective view illustrating a grinding process of a wafer rear surface in the embodiment of the present invention.
Figure 4:
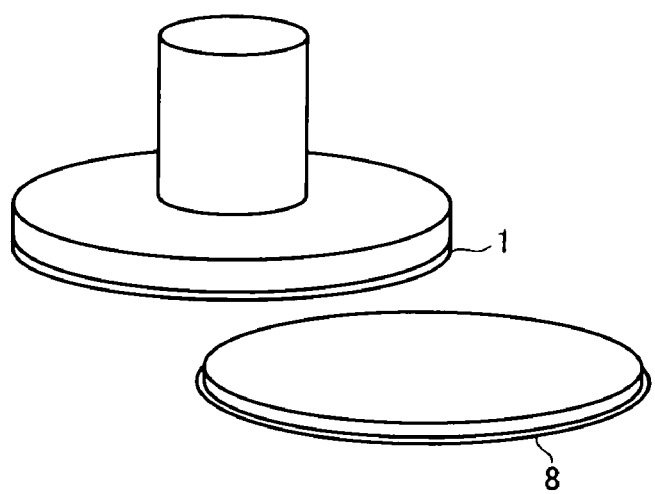
FIG. 4 is a perspective view illustrating a polishing process of the wafer rear surface in the embodiment of the present invention.
Figure 11:
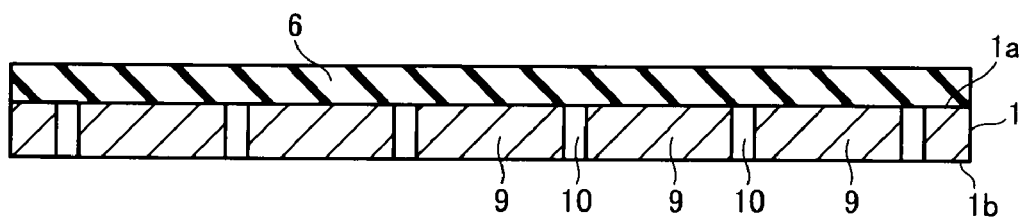
FIG. 11 is a sectional view illustrating the grinding and the polishing processes of the wafer rear surface in the embodiment of the present invention.

Next, as illustrated in FIG. 3 and FIG. 11, the second surface (rear surface) 1b of the semiconductor wafer 1 to which the protection sheet 6 is attached is grinded. Further, the second surface (rear surface) 1b of the semiconductor wafer 1 is polished as illustrated in FIG. 4. The second surface (rear surface) 1b of the semiconductor wafer 1 is mechanically grinded by using, for example, a wrapping plate 7 as illustrated in FIG. 3. Subsequently, it is polished (for example, a dry polishing) by using a polishing plate 8, as illustrated in FIG. 4. Further, the viscous layer is cured by irradiating ultraviolet light and so on to the protection sheet 6 after the grinding and polishing processes of the semiconductor wafer 1.

The grinding and polishing processes of the second surface (rear surface) 1b of the semiconductor wafer 1 are performed so as to reach the grooves 4 formed from the first surface (front surface) 1a side. As stated above, the second surface (rear surface) 1b of the semiconductor wafer 1 is grinded, and thereby, each of the chip areas 2 are separated into pieces and semiconductor chips 9 are manufactured. At this stage, each of the semiconductor chips 9 are held by the protection sheet 6, and a wafer shape is maintained as a whole. Namely, the semiconductor chips 9 are respectively separated into pieces while maintaining the shape of the semiconductor wafer 1 by the protection sheet 6. Gaps 10 corresponding to widths of the grooves 4 exist between the separated semiconductor chips 9.

Figure 5:
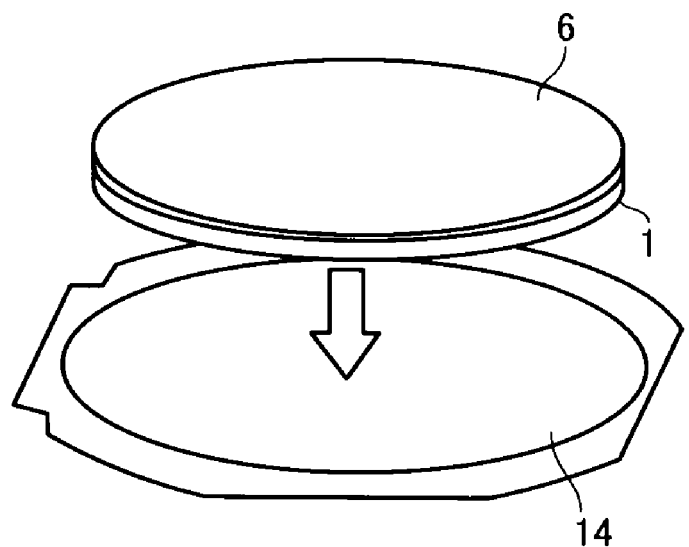
FIG. 5 is a perspective view illustrating an attaching process of a laminated film having a supporting film, a dicing film, and an adhesive film to the wafer rear surface in the embodiment of the present invention.
Figure 12:
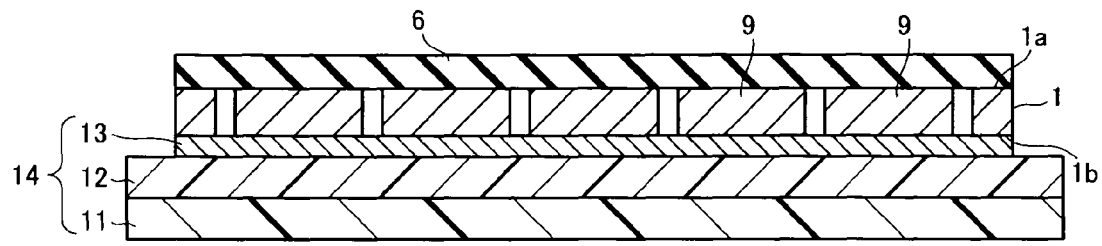
FIG. 12 is a sectional view illustrating the attaching process of the laminated film having the supporting film, the dicing film, and the adhesive film to the wafer rear surface in the embodiment of the present invention.

Next, as illustrated in FIG. 5 and FIG. 12, a laminated film 14 in which a dicing film 12 and an adhesive film 13 are sequentially laminated on a supporting film 11 is attached to the second surface (rear surface) 1b of the semiconductor wafer 1 of which entire shape is maintained by the protection film 6. In other words, the semiconductor chips 9 separated into pieces at the dicing before grinding process are attached (transferred) to the laminated film 14 having the supporting film 11, the dicing film 12 and the adhesive film 13. The laminated film 14 is attached to the second surface 1b of the semiconductor wafer 1 so that the adhesive film 13 is adhered to a rear surface (a surface opposite to a circuit forming surface) of the semiconductor chip 9.

The adhesive film 13 functions as an adhesive layer when the semiconductor chips 9 are mounted on a wiring board and so on, and it is cut (separated into pieces) in accordance with outer shapes of the semiconductor chips 9 after the protection sheet 6 is removed. A resin film (die-attach film) of which major constituent is a general epoxy resin, acrylic resin, polyimide resin, and so on is used for the adhesive film 13. Besides, a general ultraviolet curable viscous tape (for example, a tape in which a viscous layer in ultraviolet curable type is formed at a base material composed of a polyolefin resin such as polyethylene or polypropylene, a polyvinyl chloride resin, and so on) is used for the dicing film (dicing tape) 12.

Figure 13:
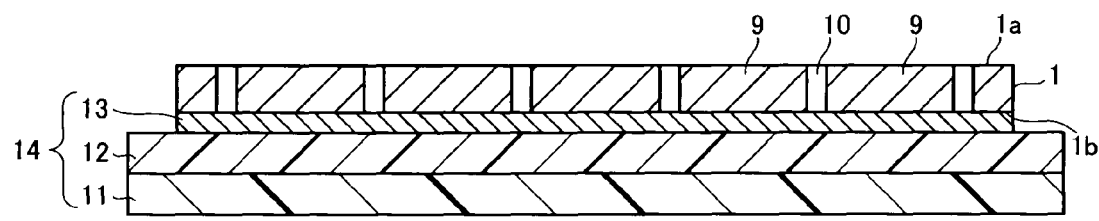
FIG. 13 is a sectional view illustrating the removal process of the protection sheet in the embodiment of the present invention.
Figure 14:
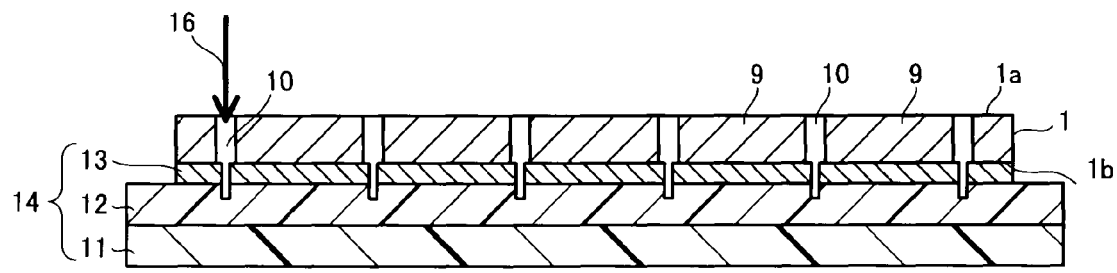
FIG. 14 is a sectional view illustrating the cutting process of the adhesive film by laser light in the embodiment of the present invention.

Subsequently, as illustrated in FIG. 6 and FIG. 13, the protection film 6 is removed from the semiconductor wafer 1 in which the laminated film 14 is attached to the second surface (rear surface) 1b. After that, as illustrated in FIG. 7 and FIG. 14, the adhesive film 13 is cut along the outer shapes of the semiconductor chips 9. The adhesive film 13 is cut by using, for example, the blade 15 as illustrated in FIG. 7. Otherwise, it is cut by irradiating laser light 16 on the adhesive film 13 as illustrated in FIG. 14. In any case, the adhesive film 13 is cut to be separated into pieces by guiding the blade 15 or the laser light 16 to a portion of gaps (calf) 10 between the semiconductor chips 9.

As stated above, the semiconductor chip 9 having the adhesive film 13 separated into pieces is manufactured by cutting the adhesive film 13 having the equivalent shape of the semiconductor wafer 1. Namely, the semiconductor chip 9 has the adhesive film 13 each corresponding to the chip shape as the adhesive layer. The semiconductor chip 9 having the separate shaped adhesive film 13 is picked up from the dicing film 12, and thereafter, mounted on a circuit base 17 such as a lead frame, a wiring substrate, and so on as illustrated in FIG. 8. When the semiconductor chip 9 is laminated in multistage, the semiconductor chip 9 having the adhesive film 13 is adhered on the other semiconductor chip.

Figure 15:
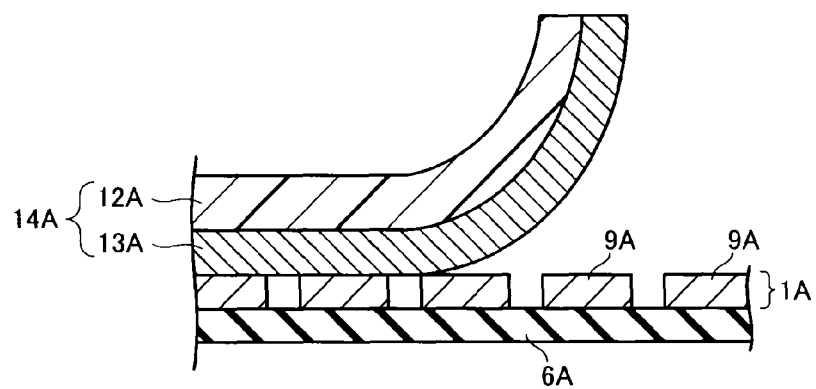
FIG. 15 is a sectional view illustrating a state in which a laminated film in two-layered structure of a dicing film and an adhesive film is attached to a rear surface of a semiconductor wafer.
Figure 16:
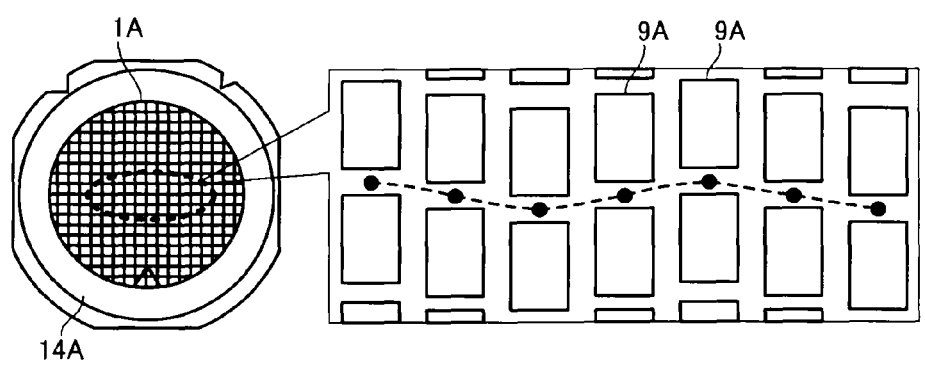
FIG. 16 is a plan view illustrating a state of the semiconductor chip after the laminated film in two-layered structure illustrated in FIG. 15 is attached to the rear surface of the semiconductor wafer.
Figure 17:
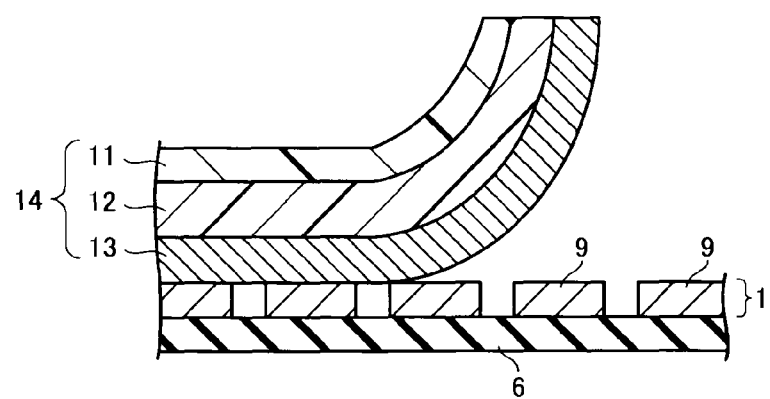
FIG. 17 is a sectional view illustrating a state in which the laminated film according to the embodiment of the present invention is attached to the rear surface of the semiconductor wafer.

Here, when the supporting film 11 is not applied, a laminated film 14A in two-layered structure in which an adhesive film 13A is laminated on a dicing film 12A is attached to semiconductor chips 9A held by a protection sheet 6A as illustrated in FIG. 15. The laminated film 14A is attached to a semiconductor wafer 1A sequentially from one end side while pressurizing with, for example, a roller. At this time, a pressure of an attaching process (transferring process) is dispersed in a lateral direction at the dicing film 12A because the base material of the laminated film 14A in two-layered structure is the dicing film 12A having elasticity. Accordingly, a displacement is easy to occur in an array of the semiconductor chips 9 as illustrated in FIG. 16. In particular, a displacement amount in a vertical direction relative to an attaching direction of the laminated film 14A becomes large.

When the array displacement of the semiconductor chips 9A in the attaching process (transferring process) of the laminated film 14A is large as illustrated in FIG. 16, the blade cannot be applied to cut the adhesive film 13A. When the adhesive film 13A is cut by the laser light, the positions of the calves 10 between the semiconductor chips 9A are detected, the laser light is irradiated in accordance with the detected points (illustrated by round marks in FIG. 16) as illustrated in FIG. 16 (a scanning line (laser cut line) of the laser light is illustrated by a dotted line in FIG. 16), and thereby, it is possible to cut the adhesive film 13A. However, the number of manufacturing processes increases because a control amount of the laser light increases, or according to cases, a deterioration of a cutting accuracy of the adhesive film 13A and so on are incurred when the array displacement of the semiconductor chips 9A is large.

Figure 18:
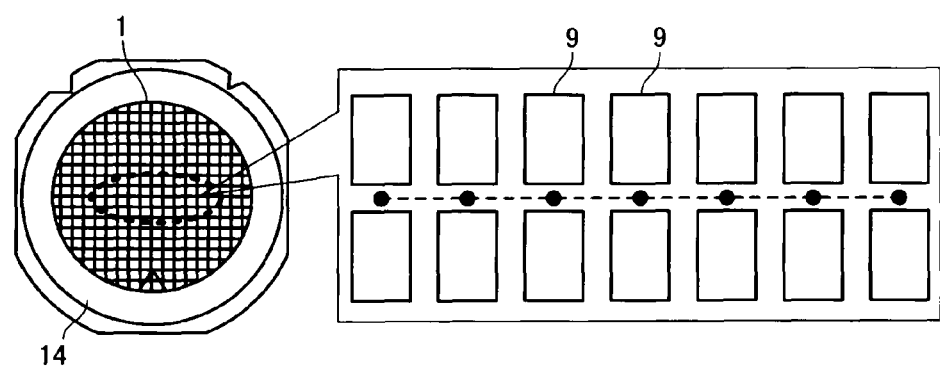
FIG. 18 is a plan view illustrating a state of the semiconductor chips after the laminated film according to the embodiment of the present invention is attached to the rear surface of the semiconductor wafer.

Accordingly, the laminated film 14 in three-layered structure in which the dicing film 12 and the adhesive film 13 are sequentially laminated on the supporting film 11 composed of a resin film with high modulus of elasticity is used in this embodiment as illustrated in FIG. 12 to FIG. 14 and FIG. 17. The laminated film 14 is attached to the semiconductor wafer 1 sequentially from one end side while pressurizing with, for example, a roller. At this time, the high modulus of elasticity resin film is used as the supporting film 11 of the dicing film 12 and the adhesive film 13, and thereby, a positional displacement (dispersion) of the attaching pressure of the laminated film 14 in the lateral direction can be suppressed. Accordingly, the array displacement of the semiconductor chips 9 can be suppressed as illustrated in FIG. 18.

The supporting film 11 suppresses the array displacement of the semiconductor chips 9 in the attaching process of the laminated film 14 based on the modulus of elasticity of its own. However, it is necessary that the supporting film 11 has a property of not disturbing the attaching process of the laminated film 14 (a process in which the laminated film 14 is bent and pressed to be attached to the semiconductor wafer 1). Accordingly, it is preferable that a resin film of which modulus of elasticity (modulus of tensile elasticity) as a resin property is within a range of 1000 MPa to 3000 MPa, and of which thickness is within a range of 25 µm to 100 µm is applied for the supporting film 11.

When the modulus of elasticity of the resin film constituting the supporting film 11 is less than 1000 MPa, the array displacement of the semiconductor chips 9 at the attaching time of the laminated film 14 cannot be fully suppressed. On the other hand, when the modulus of elasticity of the resin film constituting the supporting film 11 exceeds 3000 MPa, there is a possibility that the attachment of the laminated film 14 in itself is obstructed. Namely, when the modulus of elasticity of the resin film is too high, there is the possibility that the laminated film 14 (specifically, the adhesive film 13) cannot be adhered to each of the semiconductor chips 9 with full contact.

Further, there is also the possibility that the array displacement of the semiconductor chips 9 cannot be fully suppressed when the thickness of the resin film constituting the supporting film 11 is too thin. When the thickness of the resin film is too thick, there is the possibility that an attaching property of the laminated film 14 to the semiconductor chips 9 is deteriorated. Consequently, it is preferable that the supporting film 11 has the thickness within the range of 25 µm to 100 µm. The thickness of the supporting film 11 is more preferable to be within a range of 25 µm to 65 µm. The thickness of the supporting film 11 is appropriately set from the above-stated thickness range with considering the modulus of elasticity of the resin film constituting the supporting film 11 and the attaching process of the laminated film 14.

As the resin film constituting the supporting film 11, a polyethylene telephthalate (PET) film is exemplified. A modulus of elasticity of polyethylene telephthalate is 2000 MPa or more, and therefore, it is suitable as the resin film constituting the supporting film 11. A polypropylene film (modulus of elasticity: 1500 MPa), a polymethylpentene film (modulus of elasticity: 1500 MPa), a polyethylene naphthalate film (modulus of elasticity: 2000 MPa) can be cited as the resin film having the equivalent modulus of elasticity of the PET film. These resin films can be applied for the supporting film 11 as same as the PET film.

Table 1 illustrates amounts of chip displacement in a comparative example (when the laminated film 14A in two-layered structure of the dicing film 12A and the adhesive film 13A is used) and in the example (when the laminated film 14 in three-layered structure of the supporting film 11, the dicing film 12, and the adhesive film 13 is used). The dicing film 12 and the adhesive film 13 equivalent of the comparative example are laminated in the PET film of the laminated film 14 of the example. A minimum calf width in Table 1 is a width in which a space between both edges of the calf 10 per one line becomes the narrowest. A maximum chip displacement amount is a maximum value when the chip displacement amount is measured with a measuring interval (nm) set by "mm" unit in a measuring direction of the chip displacement, and it is converted into a displacement amount per one mm (μm/mm).

TABLE 1

|  | Attaching direction of laminated tape | | Vertical direction relative to attaching direction of laminated tape | |
| --- | --- | --- | --- | --- |
|  | Minimum calf width (μm) | Maximum chip displacement amount (μm/mm) | Minimum calf width (μm) | Maximum chip displacement amount (μm/mm) |
| Example | 31.5 | 0.60 | 29.6 | 0.43 |
| Comparative Example | 25.6 | 0.51 | 24.6 | 1.71 |

The following things are shown from Table 1. Namely, there is not much difference between the example and the comparative example as for the chip displacement amounts of the laminated tapes 14 in the attaching direction. On the other hand, the chip displacement amount in the vertical direction relative to the attaching direction of the laminated tape 14 in the example is obviously reduced compared to that of the comparative example. Namely, the array displacement of the semiconductor chips 9 at the attaching time of the laminated film 14 can be suppressed by using the laminated film 14 in which the dicing film 12 and the adhesive film 13 are sequentially laminated on the supporting film 11 composed of the resin film with high modulus of elasticity.

As stated above, the array displacement of the semiconductor chips 9 at the attaching time of the laminated film 14 can be suppressed by using the laminated film 14 in which the dicing film 12 and the adhesive film 13 are sequentially laminated on the supporting film 11 composed of the resin film with high modulus of elasticity. Accordingly, it becomes possible to easily cut the adhesive film 13 by the laser light 16 as illustrated in FIG. 14. Besides, it becomes easy to cut the adhesive film 13 by using the blade 15 as illustrated in FIG. 7 by further suppressing the array displacement of the semiconductor chips 9 based on the modulus of elasticity and the thickness of the supporting film 11.

When the adhesive film 13 is cut by the laser light 16, it is possible to reduce an alignment amount of the laser light 16 by making the array displacement of the semiconductor chips 9 small. Accordingly, it becomes possible to enable a reduction of the number of cutting processes of the adhesive film 13 by the laser light 16, an improvement of the cutting accuracy of the adhesive film 13 and so on. Further, the array displacement of the semiconductor chips 9 is made smaller, and thereby, it becomes possible to let the blade 15 pass inside the calf 10. Consequently, it becomes easy to apply the blade 15 to cut the adhesive film 13.

The supporting film 11 composed of the high modulus of elasticity resin film functions well for the suppression of the array displacement of the semiconductor chips 9 at the attaching time of the laminated film 14. On the other hand, there is a possibility that the supporting film 11 may disturb a pickup process of the semiconductor chip 9 as a subsequent process. Namely, a pickup capability of the semiconductor chip 9 is increased by pushing up the dicing film 12 from a lower side in the pickup process, but there is a possibility that the push up of the dicing film 12 becomes insufficient if the high modulus of elasticity resin film (supporting film 11) exists. Accordingly, it is preferable that the supporting film 11 is removed from the dicing film 12 before the pickup process.

As stated above, according to the manufacturing process of the semiconductor device of this embodiment, the array displacement of the semiconductor chips 9 at the attaching time of the laminated film 14 is suppressed. Accordingly, the number of cutting processes of the adhesive film 13 can be reduced, and the cutting accuracy of the adhesive film 13 can be improved. Accordingly, low cost, high accuracy, and so on of the manufacturing process of the semiconductor device including the cutting process of the semiconductor wafer 1 applying the dicing before grinding can be achieved, and further, reliability and so on of the mounting process of the semiconductor chips 9 in the subsequent process can be improved.

The manufacturing method of the semiconductor device in the present invention is not limited to the above-stated embodiments, but it can be applied to a manufacturing process of various semiconductor devices including the cutting process of the semiconductor wafer applying the dicing before grinding. Concrete manufacturing process of the semiconductor device can be variously modified as long as it satisfies a basic constitution of the present invention. Further, the embodiments of the present invention can be expanded/modified without departing from the spirit or essential characteristics thereof, and such expanded/modified embodiments are also included in the technical scope of the present invention.

What is claimed is:

1. A manufacturing method of a semiconductor device, comprising:
   forming grooves along plural chip areas from a first surface side at a semiconductor wafer having the first surface in which the plural chip areas are arranged and a second surface at an opposite side of the first surface;
   separating the plural chip areas into pieces by grinding the second surface of the semiconductor wafer after a protection sheet is attached to the first surface of the semiconductor wafer while maintaining a shape of the semiconductor wafer by the protection sheet;
   attaching a laminated film to the second surface of the semiconductor wafer held by the protection sheet, the laminated film including a supporting film, a dicing film, and an adhesive film, the supporting film being composed of a resin film with high modulus of elasticity, the dicing film and the adhesive film being sequentially laminated on the supporting film; and
   cutting the adhesive film from the first surface side of the semiconductor wafer along the chip areas after the protection sheet is removed from the semiconductor wafer so as not to cut completely through the supporting film and the dicing film.

2. The manufacturing method of the semiconductor device according to claim 1, further comprising,
   removing the separated semiconductor wafer from the supporting film and the dicing film together with the cut adhesive film.

3. The manufacturing method of the semiconductor device according to claim 2, further comprising,
   adhering the separated semiconductor wafer to a circuit base by the cut adhesive film.

4. The manufacturing method of the semiconductor device according to claim 1,
   wherein the supporting film has a modulus of elasticity within a range of not less than 1000 MPa nor more than 3000 MPa, and a thickness within a range of not less than 25 μm nor more than 100 μm.

5. The manufacturing method of the semiconductor device according to claim 4, wherein the supporting film has a thickness within a range of not less than 25 μm nor more than 65 μm.

6. The manufacturing method of the semiconductor device according to claim 1,
wherein the supporting film includes polyethylene telephthalate, polypropylene, polymethylpentene, or polyethylene naphthalate.

7. The manufacturing method of the semiconductor device according to claim 6,
wherein the supporting film includes polyethylene telephthalate.

8. The manufacturing method of the semiconductor device according to claim 1,
wherein a major constituent of the adhesive film is an epoxy resin, an acrylic resin, or a polyimide resin.

9. The manufacturing method of the semiconductor device according to claim 1,
wherein the dicing film has a base material and an ultraviolet curable viscous layer.

10. The manufacturing method of the semiconductor device according to claim 9,
wherein the base material includes a polyolefin resin or a polyvinyl chloride resin.

11. The manufacturing method of the semiconductor device according to claim 1,
wherein the adhesive film is cut by irradiating laser light.

12. The manufacturing method of the semiconductor device according to claim 1,
wherein the adhesive film is cut by using a second blade of which blade thickness is thinner than a first blade forming the grooves.

* * * * *